(12) United States Patent
Lee et al.

(10) Patent No.: US 11,276,830 B2
(45) Date of Patent: Mar. 15, 2022

(54) DISPLAY APPARATUS

(71) Applicant: Samsung Display Co., Ltd., Yongin-Si (KR)

(72) Inventors: Jinsuk Lee, Yongin-si (KR); Jinsuk Park, Yongin-si (KR); Jingoo Jung, Yongin-si (KR)

(73) Assignee: Samsung Display Co., Ltd.

( * ) Notice: Subject to any disclaimer, the term of this patent is extended or adjusted under 35 U.S.C. 154(b) by 0 days.

(21) Appl. No.: 15/481,156

(22) Filed: Apr. 6, 2017

(65) Prior Publication Data

US 2018/0053906 A1 Feb. 22, 2018

(30) Foreign Application Priority Data

Aug. 18, 2016 (KR) .................... 10-2016-0104984

(51) Int. Cl.
*H01L 51/00* (2006.01)
*H01L 51/52* (2006.01)
*H01L 27/32* (2006.01)

(52) U.S. Cl.
CPC ...... *H01L 51/0097* (2013.01); *H01L 27/3276* (2013.01); *H01L 51/5253* (2013.01); *H01L 51/5246* (2013.01); *H01L 2251/5338* (2013.01); *Y02E 10/549* (2013.01)

(58) Field of Classification Search
CPC ............. H01L 51/0097; H01L 51/5253; H01L 27/3276
USPC .......................................................... 257/40
See application file for complete search history.

(56) References Cited

U.S. PATENT DOCUMENTS

| 8,791,455 | B2 | 7/2014 | Kim et al. | |
|---|---|---|---|---|
| 2013/0146136 | A1* | 6/2013 | Seo | H01L 31/0682 136/256 |
| 2014/0097408 | A1* | 4/2014 | Kim | H01L 27/3276 257/40 |
| 2014/0232956 | A1* | 8/2014 | Kwon | H01L 27/3276 349/12 |
| 2014/0322842 | A1* | 10/2014 | Hwang | H01L 51/0009 438/28 |

(Continued)

FOREIGN PATENT DOCUMENTS

| EP | 2814074 A1 | 12/2014 |
|---|---|---|
| EP | 3051333 A1 | 8/2016 |
| KR | 10-2002-0049941 A | 6/2002 |

(Continued)

OTHER PUBLICATIONS

Extended European Search Report corresponding to EP Application No. 17186498.6, dated Jan. 25, 2018, 10 pages.

*Primary Examiner* — Vongsavanh Sengdara
(74) *Attorney, Agent, or Firm* — Innovation Counsel LLP

(57) ABSTRACT

Provided is a display apparatus that may minimize the occurrence of defects such as short-circuits during a manufacturing process. The display apparatus includes: a substrate having a bent region located between a first region and a second region and bent in the bent region about a bending axis; an organic material layer located on the substrate to correspond to the bent region and including a second opening or a second groove that extends in a direction that intersects the bending axis; and a first conductive layer extending from the first region through the bent region to the second region and located on the organic material layer.

17 Claims, 9 Drawing Sheets

(56) References Cited

U.S. PATENT DOCUMENTS

2014/0353670 A1* 12/2014 Youn .................. H01L 51/0097
257/72
2015/0382446 A1* 12/2015 Kwon ................. H01L 27/3276
174/251

FOREIGN PATENT DOCUMENTS

| KR | 10-2005-0062797 A | 6/2005 |
| KR | 10-2014-0045193 A | 4/2014 |
| KR | 10-2015-0105596 A | 9/2016 |
| WO | 2016-093476 A1 | 6/2016 |

* cited by examiner

DISPLAY APPARATUS

CROSS-REFERENCE TO RELATED APPLICATION

This application claims the benefit of Korean Patent Application No. 10-2016-0104984, filed on Aug. 18, 2016, in the Korean Intellectual Property Office, the disclosure of which is incorporated herein in its entirety by reference.

BACKGROUND

1. Field

The present disclosure relates to a display apparatus, and more particularly, to a bent display apparatus that may minimize the occurrence of defects such as short-circuits during a manufacturing process.

2. Description of the Related Art

In general, a display apparatus includes a display unit located on a substrate. Visibility at various angles may be improved or an area of a non-display region may be reduced by bending at least a part of the display apparatus.

However, a conventional bent display apparatus has problems in that defects may occur during a process of manufacturing.

SUMMARY

One or more embodiments of the present disclosure include a display apparatus that may minimize the occurrence of defects such as short-circuits during a manufacturing process.

Additional aspects will be set forth in part in the description which follows and, in part, will be apparent from the description, or may be learned by practice of the presented embodiments.

According to one or more embodiments, a display apparatus includes: a substrate having a bent region located between a first region and a second region and bent in the bent region about a bending axis; an organic material layer located on the substrate to correspond to the bent region and including a second opening or a second groove that extends in a direction that intersects the bending axis; and a first conductive layer extending from the first region through the bent region to the second region and located on the organic material layer.

The display apparatus may further include an inorganic insulating layer located on the substrate and including a first opening or a first groove corresponding to the bent region, wherein the organic material layer fills at least a part of the first opening or the first groove. In this case, the first opening or the first groove may overlap the bent region. Furthermore, an area of the first opening or the first groove may be greater than an area of the bent region.

The display apparatus may further include a second conductive layer electrically connected to the first conductive layer and located in the first region or the second region, and the second conductive layer is located on a layer different from a layer on which the first conductive layer is located. In this case, an elongation of the first conductive layer may be greater than an elongation of the second conductive layer.

The second opening or the second groove may extend in the direction parallel to a direction in which the first conductive layer extends. In detail, the first conductive layer may extend in a zigzag shape from the first region through the bent region to the second region, and the second opening or the second groove may extend in the direction parallel to a direction in which the first conductive layer extends.

The display apparatus may further include an additional conductive layer located in the second opening or the second groove and spaced apart from the first conductive layer.

The additional conductive layer may include a same material as a material included in the first conductive layer. In detail, the first conductive layer may have a structure including multi-layers, and the additional conductive layer may include a same material as a material included in at least one of the multi-layers of the first conductive layer. Furthermore, the first conductive layer may have a structure including multi-layers, and the additional conductive layer may include a same material as a material included in a lowermost layer of the multi-layers of the first conductive layer.

The organic material layer may further include a third opening or a third groove extending along the bending axis.

The second opening or the second groove may not overlap the first conductive layer.

A plurality of the first conductive layers may be provided, and the second opening or the second groove may be interposed between the plurality of first conductive layers.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
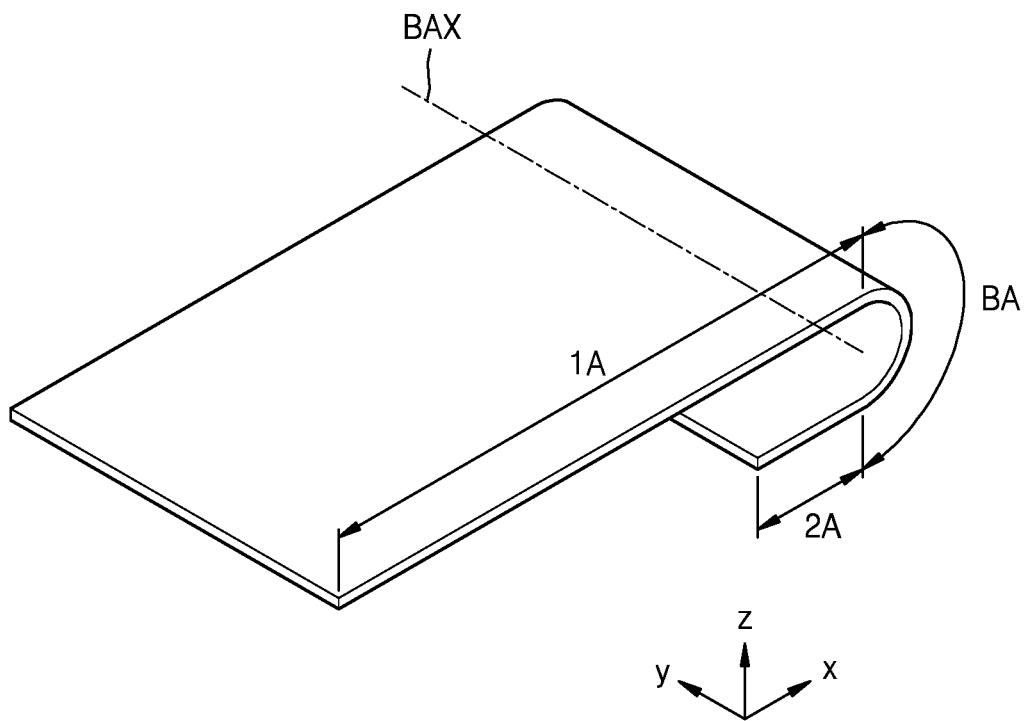
FIG. 1 is a perspective view illustrating a part of a display apparatus, according to an embodiment.

The present disclosure describes various embodiments and modifications, and embodiments thereof will be illustrated in the drawings and will be described herein in detail. The effects and features of the present disclosure and the accompanying methods thereof will become apparent from the following description of the embodiments, taken in conjunction with the accompanying drawings. However, the present disclosure is not limited to the embodiments described below, and may be embodied in various modes.

Hereinafter, the present disclosure will be described in detail by explaining embodiments with reference to the attached drawings. Like elements are denoted by like reference numerals in the drawings, and thus a repeated explanation thereof will not be given.

It will be understood that when a component, such as a layer, a film, a region, or a plate, is referred to as being "on" another component, the component may be directly on the other component or intervening components may be present thereon. Sizes of components in the drawings may be exaggerated for convenience of explanation. In other words, since sizes and thicknesses of components in the drawings are arbitrarily illustrated for convenience of explanation, the following embodiments are not limited thereto.

In the following examples, an x-axis, a y-axis and a z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

As used herein, the term "and/or" includes any and all combinations of one or more of the associated listed items. Expressions such as "at least one of" when preceding a list of elements, modify the entire list of elements and do not modify the individual elements of the list.

Figure 2:
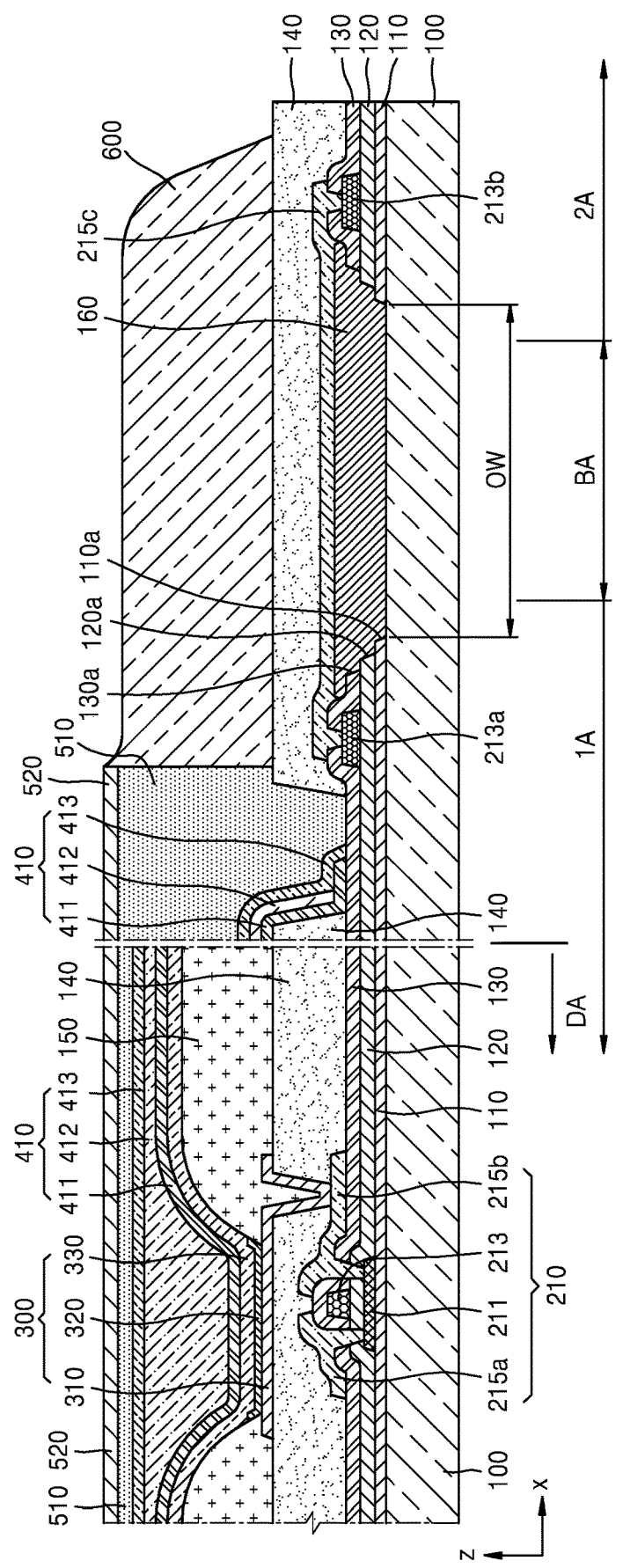
FIG. 2 is a cross-sectional view illustrating a part of the display apparatus of FIG. 1.
Figure 3:
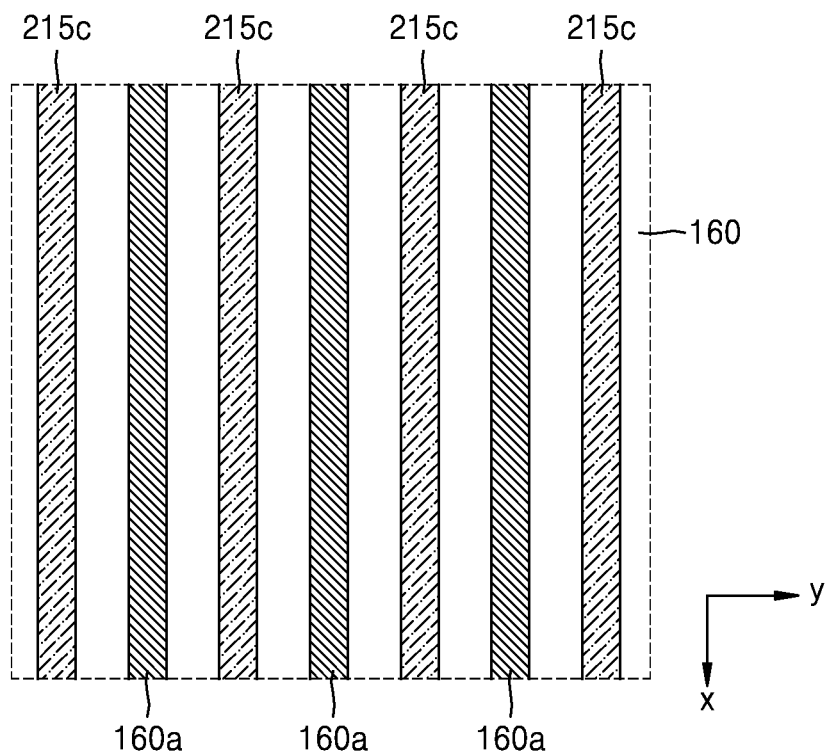
FIG. 3 is a plan view illustrating a part of the display apparatus of FIG. 1.

FIG. 1 is a perspective view illustrating a part of a display apparatus, according to an embodiment. FIG. 2 is a cross-sectional view illustrating a part of the display apparatus of FIG. 1. FIG. 3 is a plan view illustrating a part of the display apparatus of FIG. 1.

As shown in FIGS. 1 through 3, a substrate 100 of the display apparatus according to the present embodiment includes a bent region BA that extends in a first direction (e.g., +y direction). The bent region BA is located between a first region 1A and a second region 2A in a second direction (e.g., +x direction) that intersects the first direction. The substrate 100 is bent about a bending axis BAX that extends in the first direction (e.g., +y direction) as shown in FIG. 1. The substrate 100 may include any of various flexible or bendable materials. For example, the substrate 100 may include a polymer resin such as polyethersulfone (PES), polyacrylate (PAR), polyetherimide (PEI), polyethylene naphthalate (PEN), polyethylene terephthalate (PET), polyphenylene sulfide (PPS), polyarylate, polyimide (PI), polycarbonate (PC), or cellulose acetate propionate (CAP).

The first region 1A includes a display region DA. The first region 1A may include not only the display region DA but also a part of a non-display region outside the display region DA as shown in FIG. 2. The second region 2A also includes another part of the non-display region.

Referring to FIG. 2, a display device 300 and a thin-film transistor (TFT) 210 to which the display device 300 is electrically connected may be located in the display region DA of the substrate 100. In one embodiment, the display device 300 may be an organic light-emitting device. In this case, a pixel electrode 310 of the display device 300 is electrically connected to the TFT 210.

The TFT 210 may include a semiconductor layer 211 including amorphous silicon, polycrystalline silicon, and/or an organic semiconductor material, a gate electrode 213, a source electrode 215a, and a drain electrode 215b. A gate insulating film 120 including an inorganic material such as silicon oxide, silicon nitride, and/or silicon oxynitride may be located between the semiconductor layer 211 and the gate electrode 213 to insulate the semiconductor layer 211 from the gate electrode 213. In addition, an interlayer insulating film 130 including an inorganic material such as silicon oxide, silicon nitride, and/or silicon oxynitride may be located on the gate electrode 213, and the source electrode 215a and the drain electrode 215b may be located on the interlayer insulating film 130. The gate insulating film 120 and the interlayer insulating film 130 including an inorganic material may be formed by chemical vapor deposition (CVD) or atomic layer deposition (ALD). This also applies to the following embodiments and modifications thereof.

A buffer layer 110 including an inorganic material such as silicon oxide, silicon nitride, and/or silicon oxynitride may be located between the TFT 210 and the substrate 100. The buffer layer 110 may improve flatness of a top surface of the substrate 100 or may prevent or minimize penetration of impurities from the substrate 100 or the like into the semiconductor layer 211 of the TFT 210.

A planarization layer 140 may be located on the TFT 210. For example, when an organic light-emitting device is located on the TFT 210, the planarization layer 140 may substantially planarize a top surface of a protective film that covers the TFT 210. The planarization layer 140 may be formed of an organic material such as acryl, benzocyclobutene (BCB), or hexamethyldisiloxane (HMDSO). Although the planarization layer 140 is shown to have a single-layer structure in FIG. 2, embodiments are not limited thereto, and the planarization layer 140 may be modified in various ways. For example, the planarization layer 140 may have a multi-layer structure. The planarization layer 140 has an opening outside the display region DA, to physically separate a portion of the planarization layer 140 in the display region DA and a portion of the planarization layer 140 in the second region 2A. The opening of the planarization layer 140 can prevent external impurities from penetrating through the planarization layer 140 into the display region DA.

The display device 300 may be located on the planarization layer 140 within the display region DA of the substrate 100. The display device 300 may be an organic light-emitting device including, for example, the pixel electrode 310, a counter electrode 330, and an intermediate layer 320 located between the pixel electrode 310 and the counter electrode 330. The pixel electrode 310 is electrically connected to the TFT 210 by contacting any one of the source electrode 215a and the drain electrode 215b through an opening formed in the planarization layer 140.

A pixel-defining film 150 may be located on the planarization layer 140. The pixel-defining film 150 defines a pixel by having an opening corresponding to each sub-pixel, that is, an opening through which at least a central portion of the pixel electrode 310 is exposed. In addition, the pixel-defining film 150 prevents arcs from being generated on an edge of the pixel electrode 310 by increasing a distance between the edge of the pixel electrode 310 and the counter electrode 330 that is located on the pixel electrode 310. The pixel-defining film 150 may be formed of an organic material such as polyimide or HMDSO.

The intermediate layer 320 of the organic light-emitting device may include a low-molecular weight material or a high-molecular weight material. When the intermediate layer 320 includes a low-molecular weight material, the intermediate layer 320 may have a single-layer structure or a multi-layer structure formed by stacking a hole injection layer (HIL), a hole transport layer (HTL), an emission layer (EML), an electron transport layer (ETL), and/or an electron injection layer (EIL). The intermediate layer 320 may include any of various organic materials such as copper phthalocyanine (CuPc), N,N'-Di(naphthalene-1-yl)-N,N'-diphenyl-benzidine (NPB), or tris-8-hydroxyquinoline aluminum (Alq3). Each layer may be formed by vapor deposition.

When the intermediate layer 320 includes a high-molecular weight material, the intermediate layer 320 may include an HTL and an EML. In this case, the HTL may include poly(3,4-ethylenedioxythiophene) (PEDOT), and the EML may include a high-molecular weight material such as a poly-phenylene vinylene (PPV)-based high-molecular weight material or a polyfluorene-based high-molecular weight material. The intermediate layer 320 may be formed by screen printing, inkjet printing, or laser-induced thermal imaging (LITI).

It will be understood that the intermediate layer 320 is not limited thereto, and may have any of various other structures. The intermediate layer 320 may include a layer integrated with a plurality of the pixel electrodes 310, or may include a layer patterned to correspond to each of the plurality of pixel electrodes 310.

The counter electrode 330 that is located in the display region DA may cover the display region DA. That is, the counter electrode 330 may be integrally formed with a plurality of the organic light-emitting devices and correspond to the plurality of pixel electrodes 310.

Since the organic light-emitting device may be easily damaged by moisture or oxygen, an encapsulation layer 410 may cover and protect the organic light-emitting device. The encapsulation layer 410 may cover the display region DA and extend beyond the display region DA. The encapsulation layer 410 may include a first inorganic encapsulation layer 411, an organic encapsulation layer 412, and a second inorganic encapsulation layer 413.

The first inorganic encapsulation layer 411 may cover the counter electrode 330 and include silicon oxide, silicon nitride, and/or silicon oxynitride. It will be understood that other layers such as a capping layer may also be located between the first inorganic encapsulation layer 411 and the counter electrode 330 in some embodiments. Since the first inorganic encapsulation layer 411 is formed over an uneven surface of the counter electrode 330, a top surface of the first inorganic encapsulation layer 411 may not be flat. The organic encapsulation layer 412 may cover the first inorganic encapsulation layer 411, and a top surface of the organic encapsulation layer 412 corresponding to the display region DA may be substantially flat. In one embodiment, the organic encapsulation layer 412 may include at least one material selected from the group consisting of polyethylene terephthalate, polyethylene naphthalate, polycarbonate, polyimide, polyethylene sulfonate, polyoxymethylene, polyarylate, and hexamethyldisiloxane. The second inorganic encapsulation layer 413 may cover the organic encapsulation layer 412 and include silicon oxide, silicon nitride, and/or silicon oxynitride. An edge of the second inorganic encapsulation layer 413 that is located outside the display region DA (e.g., in the first region 1A) may contact the first inorganic encapsulation layer 411 not to expose the organic encapsulation layer 412 to the outside.

Since the encapsulation layer 410 includes the first inorganic encapsulation layer 411, the organic encapsulation layer 412, and the second inorganic encapsulation layer 413, cracks that can occur in the encapsulation layer 410 may be prevented from being connected to each other between the first inorganic encapsulation layer 411 and the organic encapsulation layer 412 or between the organic encapsulation layer 412 and the second inorganic encapsulation layer 413. Accordingly, a path through which external moisture or oxygen penetrates into the display region DA may be blocked or minimized.

A polarizer 520 may be located on the encapsulation layer 410 by using an optically clear adhesive (OCA) layer 510. The polarizer 520 may reduce reflection of external light. For example, when passing through the polarizer 520, external light is reflected from a top surface of the counter electrode 330, and passes through the polarizer 520 again. In this case, the external light passes through the polarizer 520 twice, and a phase of the external light may be changed. As a result, the destructive interference caused by a phase difference between the incident light and the reflected light through the polarizer 520 can improve the visibility of the display apparatus. The OCA layer 510 and the polarizer 520 may cover, for example, the opening of the planarization layer 140. It will be understood that the display apparatus according to the present embodiment does not have to include the polarizer 520, and the polarizer 520 may be omitted, and other elements may be used. For example, in the absence of the polarizer 520, the reflection of external light may be reduced by using a black matrix and a color filter.

The buffer layer 110, the gate insulating film 120, and the interlayer insulating film 130 each including an inorganic material may be collectively referred to as an inorganic insulating layer. The inorganic insulating layer has a first opening corresponding to the bent region BA. That is, the buffer layer 110, the gate insulating film 120, and the interlayer insulating film 130 may respectively have openings 110a, 120a, and 130a corresponding to the bent region BA. When the first opening corresponds to the bent region BA, the first opening overlaps the bent region BA. In this case, an area of the first opening may be greater than an area of the bent region BA. To this end, a width OW of the first opening is greater than a width of the bent region BA. An area of a smallest opening from among the openings 110a, 120a, and 130a of the buffer layer 110, the gate insulating film 120, and the interlayer insulating film 130 may be defined as an area of the first opening. In FIG. 2, an area of the opening 110a of the buffer layer 110 may be defined as an area of the first opening.

The display apparatus according to the present embodiment includes an organic material layer 160 that fills at least a part of the first opening of the inorganic insulating layer. In FIG. 2, the organic material layer 160 fills the entire first opening. The display apparatus further includes a first conductive layer 215c, and the first conductive layer 215c extends from the first region 1A through the bent region BA to the second region 2A and is located on the organic material layer 160. A portion of the first conductive layer 215c may be located on the inorganic insulating layer such as the interlayer insulating film 130. The first conductive layer 215c may be formed using the same material as that of the source electrode 215a or the drain electrode 215b when the source electrode 215a or the drain electrode 215b is formed.

Although the display apparatus is not bent in FIG. 2 for the convenience of illustration, the substrate 100 or the like of the display apparatus according to the present embodiment is actually bent in the bent region BA as shown in FIG. 1 such that a rear surface of a part of the substrate 100 (in −z direction) in the first region 1A faces a rear surface of a part of the substrate 100 in the second region 2A. The display apparatus is initially manufactured so that the substrate 100 is substantially flat as shown in FIG. 2 in a manufacturing process, and subsequently the display apparatus is bent to have a shape as shown in FIG. 1 by bending the substrate 100 or the like in the bent region BA. In this case, when the substrate 100 or the like is bent in the bent region BA, a tensile stress may be applied to the first conductive layer 215c. However, in the display apparatus according to the present embodiment, defects that can occur in the first conductive layer 215c during a bending process may be prevented or minimized.

If the inorganic insulating layer such as the buffer layer 110, the gate insulating film 120, and/or the interlayer insulating film 130 does not have any opening in the bent region BA and has a continuous shape from the first region 1A to the second region 2A, and the first conductive layer 215c is located on the inorganic insulating layer, a large tensile stress is applied to the first conductive layer 215c when the substrate 100 or the like is bent. Since a hardness of the inorganic insulating layer is greater than that of an organic material layer, cracks may highly likely occur in the inorganic insulating layer in the bent region BA. Once cracks occur in the inorganic insulating layer, more cracks may occur even in the first conductive layer 215c on the inorganic insulating layer, thereby increasing the risk of defects such as short-circuits of the first conductive layer 215c.

However, in the display apparatus according to the present embodiment, the inorganic insulating layer has the first opening in the bent region BA, and a portion of the first conductive layer 215c on the bent region BA is located on the organic material layer 160 that fills at least a part of the first opening of the inorganic insulating layer. Since the inorganic insulating layer has the first opening in the bent region BA, cracks are hardly likely to occur in the inorganic insulating layer. Since the organic material layer 160 includes an organic material, cracks are hardly likely to occur in the organic material layer 160. Accordingly, cracks may be prevented from occurring in a portion of the first conductive layer 215c that is located on the organic material layer 160 and corresponds to the bent region BA. Since a hardness of the organic material layer 160 is less than that of an inorganic material layer, a tensile stress generated due to bending of the substrate 100 or the like may be absorbed by the organic material layer 160 and effectively prevented from being concentrated in the first conductive layer 215c.

Although the inorganic insulating layer has the first opening in the example shown in FIG. 2, the present disclosure is not limited thereto. For example, the inorganic insulating layer may have a first groove, instead of the first opening. For example, the buffer layer 110 may not have the opening 110a and extend from the first region 1A through the bent region BA to the second region 2A, and only the gate insulating film 120 and the interlayer insulating film 130 may have the openings 120a and 130a. Even in this case, the buffer layer 110, the gate insulating film 120, and the interlayer insulating film 130 each including an inorganic material may be collectively referred to as an inorganic insulating layer. In this case, the inorganic insulating layer may have a first groove corresponding to the bent region BA. The organic material layer 160 may fill at least a part of the first groove. Alternatively, only a part of the interlayer insulating film 130 may be removed. Even in this case, the inorganic insulating layer may have the first groove corresponding to the bent region BA.

In cases where the inorganic insulating layer has the first groove in the bent region BA, a thickness of the inorganic insulating layer in the bent region BA may be reduced, and thus the substrate 100 or the like may be smoothly bent. In addition, since the organic material layer 160 is located in the bent region BA and the first conductive layer 215c is located on the organic material layer 160, a potential damage to the first conductive layer 215c due to the bending may be effectively prevented. Although the example shown in FIG. 2 shows that the inorganic insulating layer has the first opening, it will be understood that the inorganic insulating layer may have the first groove without deviating from the scope of the present disclosure.

The display apparatus according to the present embodiment may include second conductive layers 213a and 213b in addition to the first conductive layer 215c. The second conductive layer 213a or 213b may be located in the first region 1A or the second region 2A at a layer different from the first conductive layer 215c and electrically connected to the first conductive layer 215c. Referring to FIG. 2, the second conductive layers 213a and 213b are located on the same layer, that is, the gate insulating film 120, and may be formed of the same material as that of the gate electrode 213 of the TFT 210. In addition, the first conductive layer 215c contacts each of the second conductive layers 213a and 213b through a contact hole formed in the interlayer insulating film 130. The second conductive layer 213a is located in the first region 1A and the second conductive layer 213b is located in the second region 2A.

The second conductive layer 213a located in the first region 1A may be electrically connected to a TFT or the like within the display region DA, and thus the first conductive layer 215c may be electrically connected to the TFT or the like within the display region DA through the second conductive layer 213a. The second conductive layer 213b located in the second region 2A may also be electrically connected to the TFT or the like within the display region DA through the first conductive layer 215c. The second conductive layers 213a and 213b may be located outside the display region DA and electrically connected to elements located within the display region DA. Alternatively, the second conductive layers 213a and 213b may extend to the display region DA, and at least parts of the second conductive layers 213a and 213b may be located within the display region DA.

Although the display apparatus is not bent in FIG. 2 for the convenience of illustration, the substrate 100 or the like of the display apparatus according to the present embodiment is actually bent on the bent region BA as shown in FIG. 1 as described above. Initially, the display apparatus is manufactured to have the substrate 100 substantially flat as shown in FIG. 2, and the display apparatus is subsequently bent to have a shape as shown in FIG. 1 by bending the substrate 100 or the like in the bent region BA. When the substrate 100 or the like is bent on the bent region BA, a tensile stress may be applied to the elements located within the bent region BA.

Cracks may be prevented from occurring in the first conductive layer 215c, or defects such as short-circuits may be prevented from occurring on the first conductive layer 215c by including a material with a high elongation in the first conductive layer 215c that crosses the bent region BA. In addition, the efficiency of transmitting an electrical signal of the display apparatus may be improved, or a defect rate in a manufacturing process may be reduced by forming the second conductive layers 213a and 213b by using a material having electrical/physical characteristics that are different from those of the first conductive layer 215c and having an elongation that is less than that of the first conductive layer 215c in the first region 1A or the second region 2A. For example, the second conductive layers 213a and 213b may include molybdenum, and the first conductive layer 215c may include aluminum. It will be understood that the first conductive layer 215c or the second conductive layers 213a and 213b may have a multi-layer structure. For example, the first conductive layer 215c may have a multi-layer structure including a titanium layer, an aluminum layer, and a titanium layer, and each of the second conductive layers 213a and 213b may have a multi-layer structure including a molybdenum layer and a titanium layer.

As shown in FIG. 2, the organic material layer 160 may cover an inner surface of the first opening of the inorganic insulating layer. The first conductive layer 215c may be formed using the same material as those of the source electrode 215a and the drain electrode 215b when the source electrode 215a and the drain electrode 215b are formed as described above. To this end, a conductive layer may be formed on the entire surface of the substrate 100 and patterned to form the source electrode 215a, the drain electrode 215b, and the first conductive layer 215c. If the organic material layer 160 does not cover an inner surface of the opening 110a of the buffer layer 110, an inner surface of the opening 120a of the gate insulating film 120, or an inner surface of the opening 130a of the interlayer insulating film 130, a conductive material that is not removed in and/or after a process of patterning the conductive layer may remain on the inner surface of the opening 110a of the buffer layer 110, the inner surface of the opening 120a of the gate insulating film 120, or the inner surface of the opening 130a of the interlayer insulating film 130. In this case, the remaining conductive material may cause short-circuits between different conductive layers.

Accordingly, it is preferable that when the organic material layer 160 is formed, the organic material layer 160 covers the inner surface of the first opening of the inorganic insulating layer. For reference, although the organic material layer 160 is shown to have a uniform thickness in FIG. 2, embodiments are not limited thereto, and the organic material layer 160 may have a thickness that varies according to positions. For example, a top surface of the organic material layer 160 around the inner surface of the opening 110a of the buffer layer 110, the inner surface of the opening 120a of the gate insulating film 120, or the inner surface of the opening 130a of the interlayer insulating film 130 may slope gently. Accordingly, the conductive material may be effectively removed, in and/or after the process of patterning the conductive layer to form the source electrode 215a, the drain electrode 215b, and the first conductive layer 215c.

A bending protection layer (BPL) 600 may be located outside the display region DA. For example, the BPL 600 may be located on the first conductive layer 215c to correspond to at least the bent region BA.

When a stack of layers is bent, there is a stress neutral plane in the stack. If the BPL 600 is not provided, an excessive tensile stress or the like may be applied to the first conductive layer 215c within the bent region BA as the substrate 100 or the like is bent. This is because a position of the first conductive layer 215c may not correspond to a stress neutral plane. However, when the BPL 600 is provided, a position of a stress neutral plane in a stack including all layers formed on the substrate 100, the first conductive layer 215c, and the BPL 600 may be adjusted by adjusting a thickness and a modulus of the BPL 600. Accordingly, a tensile stress applied to the first conductive layer 215c may be minimized, or a compressive stress may be applied to the first conductive layer 215c by causing the stress neutral plane to be located around or over the first conductive layer 215c by adjusting the BPL 600. For reference, the risk of damaging the first conductive layer 215c when a compressive stress is applied to the first conductive layer 215c is much less than the risk of damaging the first conductive layer 215c when a tensile stress is applied to the first conductive layer 215c.

Although in FIG. 2, in a direction (e.g., +z direction), a top surface of an end of the BPL 600 in a direction (e.g., −x direction) toward the display region DA is coplanar with a top surface of the polarizer 520, embodiments are not limited thereto. For example, an end of the BPL 600 in the direction (e.g., −x direction) toward the display region DA may cover a part of a top surface of an edge of the polarizer 520. Alternatively, the end of the BPL 600 in the direction (e.g., −x direction) toward the display region DA may not contact the polarizer 520 and/or the OCA layer 510. In particular, in the latter case, gas generated in the BPL 600 may be prevented from moving in the direction (e.g., −x direction) toward the display region DA and degrading the display device 300 or the like such as the organic light-emitting device, during or after a process of forming the BPL 600.

If in the direction (e.g., +z direction), the top surface of the end of the BPL 600 in the direction (e.g., −x direction) toward the display region DA is coplanar with the top surface of the polarizer 520, the end of the BPL 600 in the direction (e.g., −x direction) toward the display region DA covers a part of the top surface of the edge of the polarizer 520, or the end of the BPL 600 in the direction (e.g., −x direction) toward the display region DA contacts the polarizer 520 and/or the OCA layer 510, a thickness of a portion of the BPL 600 in the direction (e.g., −x direction) toward the display region DA may be greater than a thickness of other portions of the BPL 600. When the BPL 600 is formed, a liquid or paste material may be applied and cured. During the curing, a volume of the BPL 600 may be reduced. In this case, when the portion of the BPL 600 in the direction (e.g., −x direction) toward the display region DA contacts the polarizer 520 and/or the OCA layer 510, a volume of the remaining portions of the BPL 600 is reduced because a position of the portion of the BPL 600 is fixed. As a result, a thickness of the portion of the BPL 600 in the direction (e.g., −x direction) toward the display region DA may be greater than a thickness of other portions of the BPL 600.

The organic material layer 160 included in the display apparatus according to the present embodiment has a top surface including second grooves 160a that extend in a direction that intersects the bending axis BAX. Referring to FIG. 3, the organic material layer 160 includes the second grooves 160a that extend in the direction (e.g., +x direction) in which the first conductive layer 215c extends. Since the organic material layer 160 includes the second grooves 160a, defects that may occur when the first conductive layer 215c or the like is formed may be effectively prevented, which will be explained below in further detail.

Figure 4:
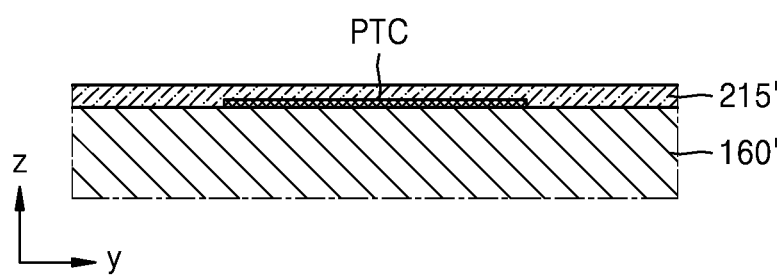
FIGS. 4 through 6 are cross-sectional views for explaining a process of manufacturing a display apparatus, according to a comparative example.
Figure 5:
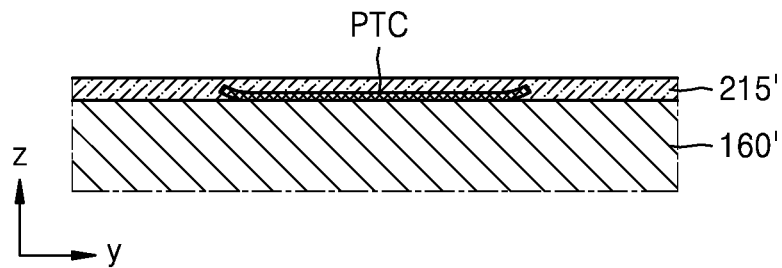
Figure 6:
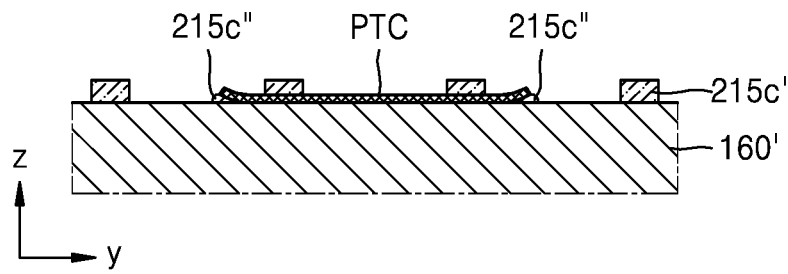

FIGS. 4 through 6 are cross-sectional views for explaining a process of manufacturing a display apparatus, according to a comparative example. In FIGS. 4 through 6, a top surface of an organic material layer 160' does not include second grooves that extend in a direction that intersects the bending axis BAX. Before a conductive material layer 215' is deposited on the organic material layer 160', a process of cleaning the organic material layer 160' or the like may be performed. However, particles PTC that are impurities may still remain on the organic material layer 160' after the cleaning process as shown in FIG. 4. When the conductive material layer 215' is deposited in this state, the particles PTC may be located between the conductive material layer 215' and the organic material layer 160'.

However, since the conductive material layer 215' is deposited at a high temperature, the particles PTC may not be flat. For example, gas is released from the organic material layer 160' in a high temperature environment, thus, outgassing may occur. The gas may not be released from a central portion of the particles PTC and is mostly released from edges of the particles PTC, and thus the edges of the particles PTC are lifted upwardly as shown in FIG. 5. Accordingly, as the conductive material layer 215' is deposited, the particles PTC are deformed and thus the conductive material layer 215' fills spaces under the edges of the particles PTC.

In this state, when first conductive layers 215c' that extend substantially in the +x direction are formed by patterning the conductive material layer 215' as shown in FIG. 6, the conductive material layer 215' in the spaces under the edges of the particles PTC may not be fully removed. As a result, an additional conductive layer 215c" may unexpectedly remain under the edges of the particles PTC. The additional conductive layer 215c" not only exists under the edges of the particles PTC but also may protrude to the outside of the particles PTC as shown in FIG. 6. This is because when the particles PTC perform a masking function, and shadow effect may also occur.

Figure 7:
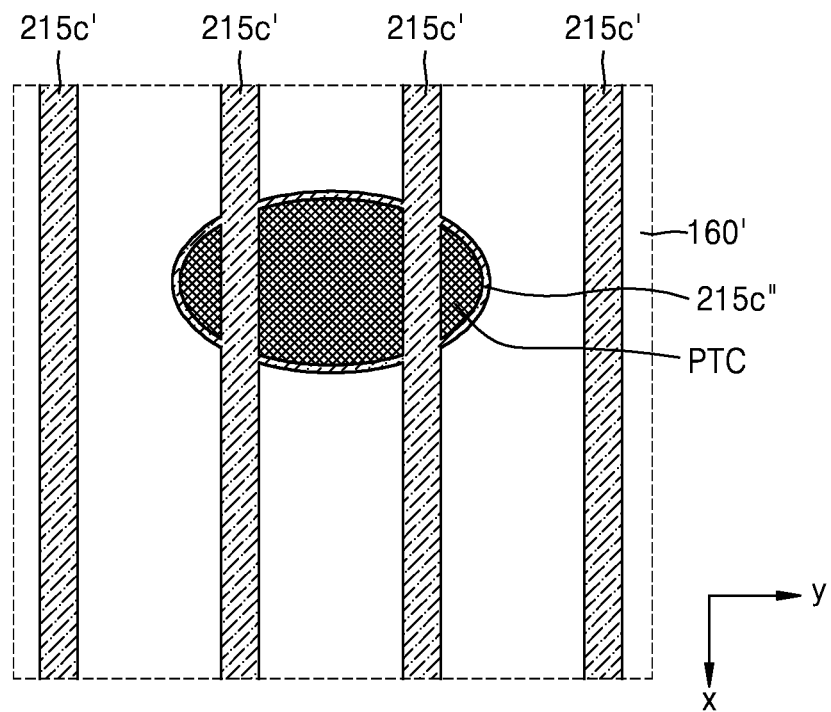
FIG. 7 is a plan view illustrating a part of a display apparatus manufactured by using the process of FIGS. 4 through 6.

In a cross-sectional view as shown in FIG. 6, the additional conductive layer 215c" is not connected to the first conductive layer 215c'. However, as shown in FIG. 7 illustrating a plan view of a part of a display apparatus manufactured by using the above process, the additional conductive layer 215c" may extend along the edges of the particles PTC. If the particles PTC are large enough to reach two adjacent first conductive layers 215c', the additional conductive layer 215c" may electrically connect the first conductive layers 215c' and cause defects such as short-circuits.

In addition, when the conductive material layer 215' has a multi-layer structure including a titanium layer, an aluminum layer, and a titanium layer, edges of the particles PTC may be lifted upwardly as shown in FIG. 5, cracks may occur in the titanium layer, the aluminum layer exposed through the cracks may be oxidized, and a relatively large aluminum oxide lump may be generated around the cracks. In this case, the titanium layer under the aluminum oxide lump may not be removed during or after the conductive material layer 215' is patterned, and the additional conductive layer 215c" that is the un-removed titanium layer may extend along the edges of the particles PTC. The additional conductive layer 215c" may electrically connect two adjacent first conductive layers 215c' and cause defects such as short-circuits as described above.

Figure 8:
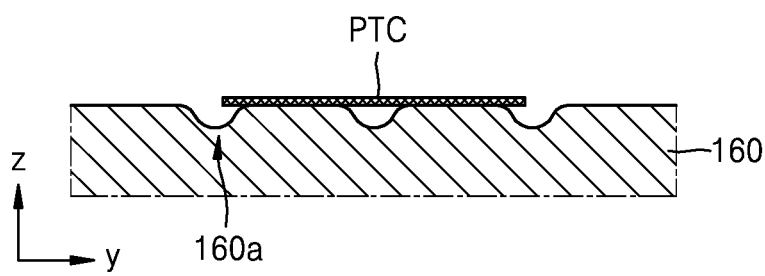
FIGS. 8 through 10 are cross-sectional views for explaining a process of manufacturing the display apparatus of FIG. 1.
Figure 9:
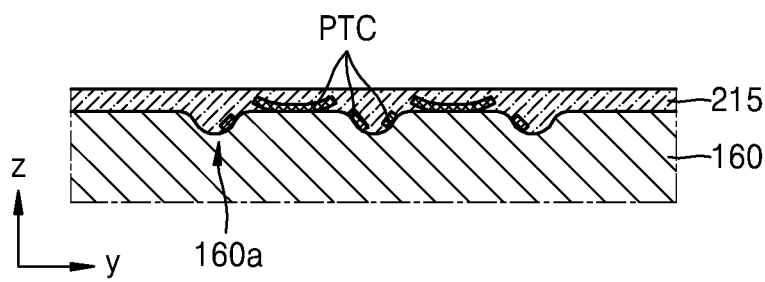

However, since the organic material layer 160 in the display apparatus according to the present embodiment includes the second grooves 160a, the above problems may be avoided. Referring to FIG. 8, even when the particles PTC are located on the organic material layer 160, some of the particles PTC may be located in the second grooves 160a. When a conductive material layer 215 is formed by deposition or the like in this state, the particles PTC may be separated into a plurality of fractions in the second grooves 160a as shown in FIG. 9. This is because a pressure is applied to the particles PTC in a process of forming the conductive material layer 215, and thus portions of the organic material layer 160 having the second grooves 160a do not support the particles PTC.

As the particles PTC are separated into a plurality of fractions, the particles PTC are hardly deformed, or only some of the fractions of the particles PTC may be deformed because the gas generated in the organic material layer 160 is discharged between the fractions to the outside. Accordingly, when a plurality of the first conductive layers 215c are formed by patterning the conductive material layer 215 as shown in FIG. 10, the conductive material layer 215 does not remain under the particles PTC, or even when the conductive material layer 215 remains, and additional conductive layers 215ca are formed, adjacent first conductive layers 215c may not be electrically connected to each other.

Figure 10:
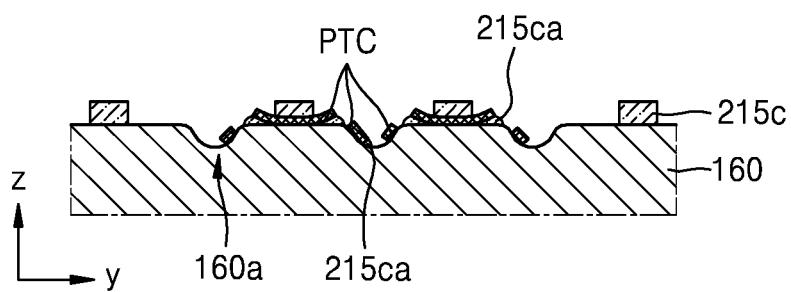
Figure 11:
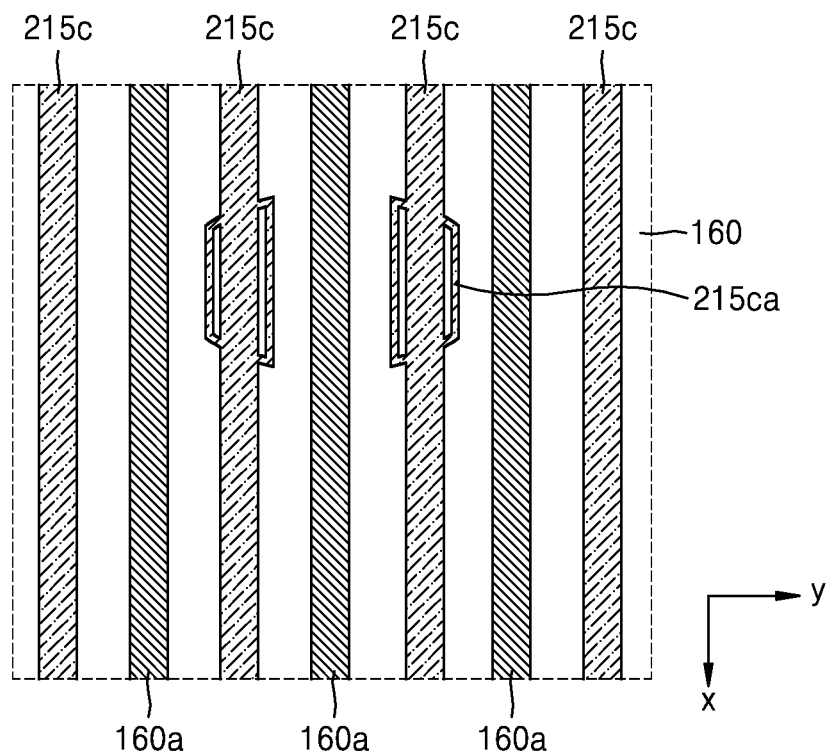
FIG. 11 is a plan view illustrating a part of a display apparatus manufactured by using the process of FIGS. 8 through 10.

FIG. 11 is a plan view illustrating a part of a display apparatus manufactured by using a process of FIGS. 8 through 10. For convenience, the particles PTC are not shown. Even when the additional conductive layers 215ca are provided, the additional conductive layers 215ca are located along edges of only some of the fractions of the particles PTC. Accordingly, although one additional conductive layer 215ca may be connected to one first conductive layer 215c, the additional conductive layer 215ca is spaced apart from another first conductive layer 215c by one second groove 160a interposed between the first conductive layer 215c and the another first conductive layer 215c. In addition, any additional conductive layer 215ca located within each second groove 160a is spaced apart from the first conductive layers 215c located outside the second groove 160a. As such, even when the additional conductive layers 215ca are provided, the additional conductive layers 215ca do not electrically connect the adjacent first conductive layers 215c. Accordingly, the display apparatus according to the present embodiment may prevent short-circuits between the adjacent first conductive layers 215c.

According to one embodiment, the additional conductive layers 215ca are generated when the first conductive layers 215c are formed, and the additional conductive layers 215ca include the same material as that of the first conductive layers 215c. If the first conductive layers 215c have a multi-layer structure including a titanium layer, an aluminum layer, and a titanium layer, the additional conductive layers 215ca include the same material as a material included in any one of multi-layers of the first conductive layers 215c. Since the additional conductive layers 215ca may be formed under edges of the particles PTC, the additional conductive layers 215ca may include the same material as a material included in the lowermost layer of the multi-layers of the first conductive layers 215c. For example, when the first conductive layer 215c has a multi-layer structure including a titanium layer, an aluminum layer, and a titanium layer, the additional conductive layers 215ca may include titanium.

As shown in FIG. 3 or 11, the second groove 160a may extend substantially in a direction parallel to a direction in which the first conductive layer 215c extends. When a plurality of the first conductive layers 215c are provided, the second grooves 160a may be interposed between the first conductive layers 215c. Accordingly, short-circuits between the adjacent first conductive layers 215c may be prevented by interposing each of the second grooves 160a between the adjacent first conductive layers of the first conductive layers 215c.

Figure 12:
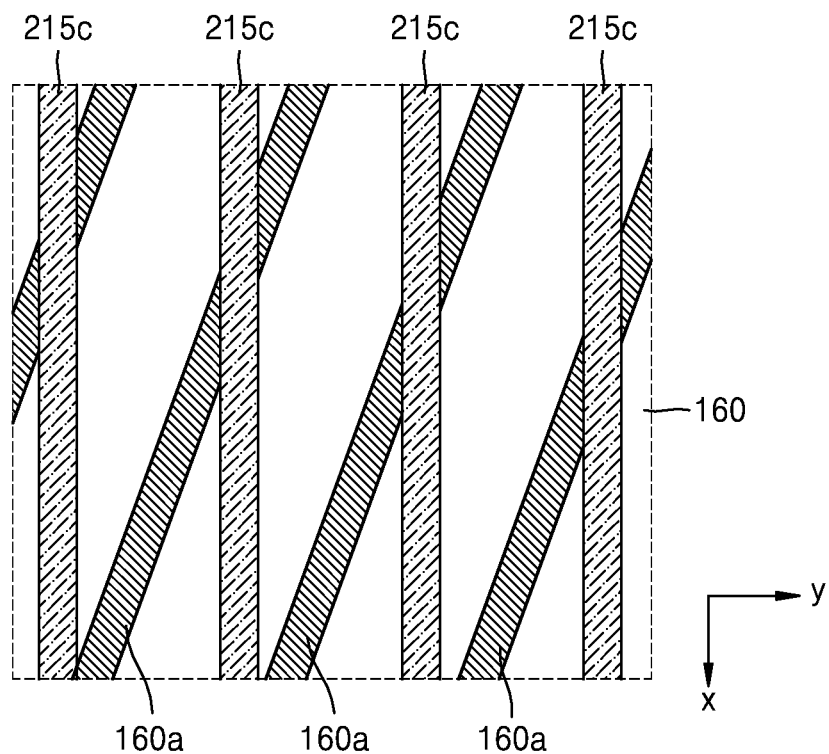
FIG. 12 is a plan view illustrating a part of a display apparatus, according to another embodiment.

As shown in FIG. 3 or 11, the second groove 160a may not overlap the first conductive layer 215c. However, embodiments are not limited thereto, and as shown in FIG. 12 illustrating a plan view of a part of a display apparatus according to another embodiment, the second grooves 160a may not be parallel to the first conductive layers 215c and may intersect the first conductive layers 215c to partially overlap the first conductive layers 215c. However, even in this case, the particles PTC are separated into a plurality of fractions due to the second grooves 160a if the particles PTC are not very large, thereby effectively preventing short-circuits between the adjacent first conductive layers 215c.

Figure 13:
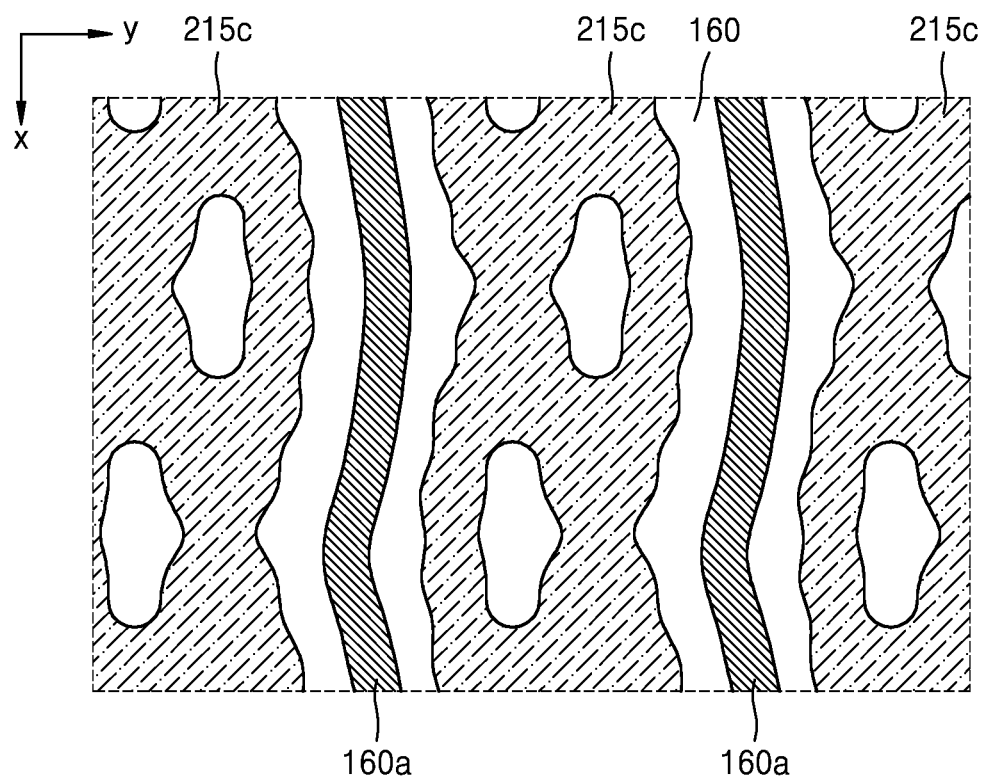
FIG. 13 is a plan view illustrating a part of a display apparatus, according to another embodiment.

Although the second grooves 160a linearly extend in a plan view, embodiments are not limited thereto. As shown in FIG. 13 illustrating a plan view of a part of a display apparatus according to another embodiment, the second grooves 160a may substantially extend in the +x direction and may have various shapes other than a linear shape. For example, when the first conductive layers 215c extend from the first region 1A through the bent region BA to the second region 2A in a zigzag shape in a plan view, the second grooves 160a may also extend substantially in parallel to the first conductive layers 215c to locally have a zigzag shape in a plan view.

Referring to FIG. 13, the first conductive layers 215c may locally have through-holes in the bent region BA to minimize a damage when the substrate 100 or the like is bent. In this case, positions of the through-holes of the first conductive layers 215c may be located substantially in a zigzag fashion in a direction in which the first conductive layers 215c extend. Accordingly, edges of the first conductive layers 215c may have substantially a zigzag shape, and the second grooves 160a may also have substantially a zigzag shape.

Figure 14:
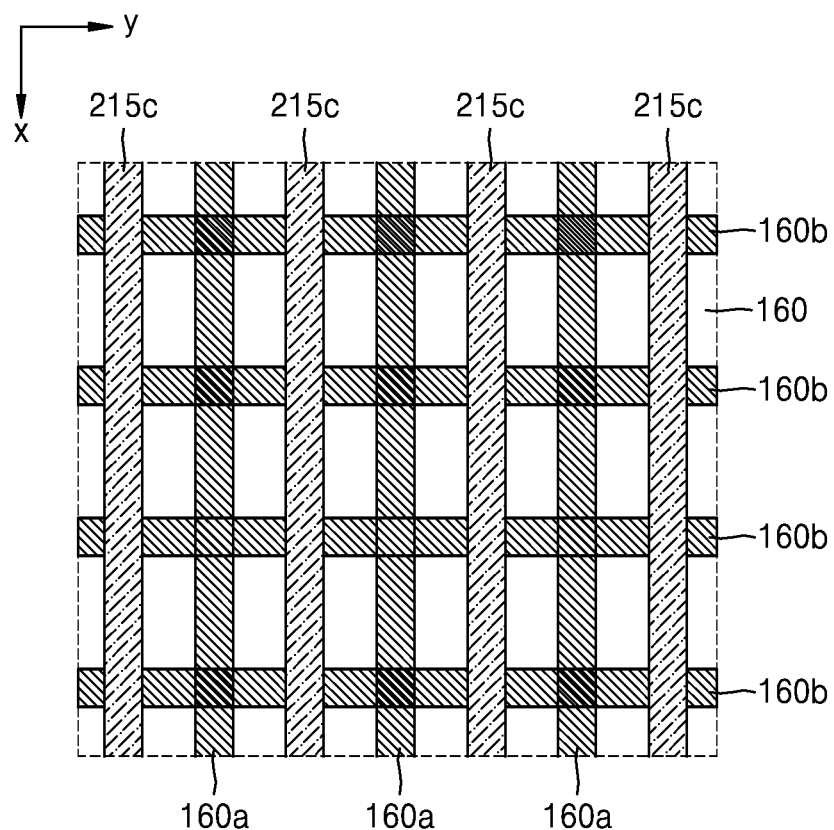
FIG. 14 is a plan view illustrating a part of a display apparatus, according to another embodiment.

Although the organic material layer 160 includes only the second groove 160a, embodiments are not limited thereto. As shown in FIG. 14 illustrating a plan view of a part of a display apparatus according to another embodiment, a top surface of the organic material layer 160 may also include a plurality of third grooves 160b. The third grooves 160b may extend in a direction (e.g., +y direction) in which the bending axis BAX (see FIG. 1) extends. Since the top surface of the organic material layer 160 has the third grooves 160b, the top surface of the organic material layer 160 may be uneven. In this case, the first conductive layers 215c located on the organic material layer 160 also has a shape corresponding to a shape of the top surface of the organic material layer 160, and thus a surface area of the first conductive layers 215c is increased. Accordingly, when the substrate 100 or the like is bent on the bent region BA, short-circuits on the first conductive layers 215c may be more effectively prevented.

Figure 15:
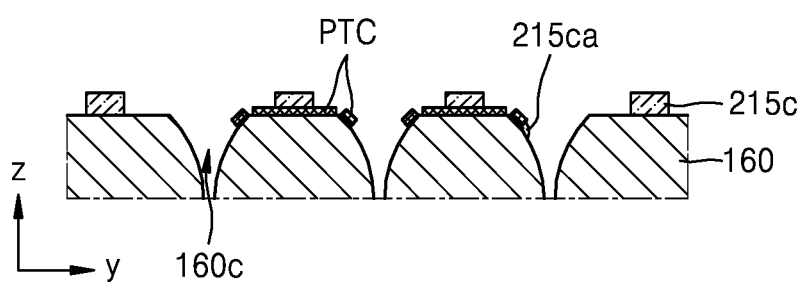
FIG. 15 is a cross-sectional view illustrating a part of a display apparatus, according to another embodiment.

Embodiments are not limited to the organic material layer 160 including only the second grooves 160a. For example, as shown in FIG. 15 illustrating a cross-sectional view of a part of a display apparatus according to another embodiment, the organic material layer 160 may have second openings 160c that pass through the organic material layer 160 along the z-axis, instead of the second grooves 160a. It will be understood that the second openings 160c may perform the substantially similar function as that of the second grooves 160a, and an extension direction or a shape of the second openings 160c in a plan view may be the same as or similar to that of the second grooves 160a. The description of the second grooves 160a may apply to the second openings 160c. For reference, although the organic material layer 160 may include the third grooves 160b that extend in a direction in which the bending axis BAX extends as shown in FIG. 14, the organic material layer 160 may include third openings having an extension direction or a shape in a plan view that is the same as and/or similar to that of the third grooves 160b.

Embodiments are not limited to the inorganic insulating layer including the first opening or the first grooves in the bent region BA. For example, the inorganic insulating layer may not include the first opening or the first groove, and may extend with a substantially uniform thickness from the first region 1A to the bent region BA. In this case, the organic material layer 160 may be located on the substrate 100, for example, the inorganic insulating layer such as the buffer layer 110, the gate insulating film 120, and the interlayer insulating film 130, to correspond to at least the bent region BA, and the first conductive layers 215c may be located on the organic material layer 160. In this case, the organic material layer 160 may include the second openings or the second grooves that extend in a direction that intersects the bending axis BAX as described above.

In general, the organic material layer 160 has higher elasticity or flexibility than that of an inorganic material layer, therefore the organic material layer 160 may not be damaged even when the substrate 100 or the like is bent. When the organic material layer 160 is not damaged, wiring lines such as the first conductive layers 215c on the organic material layer 160 may be prevented from being damaged or may be hardly damaged. Accordingly, a display apparatus that may prevent or minimize a damage to the wring lines such as the first conductive layers 215c may be provided by using such a structure. Cracks may occur in the inorganic material layer when the substrate 100 or the like is bent. However, since the first conductive layers 215c are located on the organic material layer 160 having relatively high elasticity or flexibility, a damage to the first conductive layers 215c may be prevented or minimized.

Although the inorganic insulating layer includes the first opening or the first groove in the above embodiments and modifications thereof, the inorganic insulating layer may not include the first opening or the first groove in the embodiments or the modifications thereof as described above.

According to one or more embodiments, a display apparatus that may minimize defects such as short-circuits in a manufacturing process may be provided. However, the scope of the present disclosure is not limited by such effects.

While one or more embodiments have been described with reference to the figures, it will be understood by those of ordinary skill in the art that various changes in form and details may be made therein without departing from the spirit and scope.

What is claimed is:
1. A display apparatus comprising:
  a substrate extending in an extending direction and having a first region, a second region, and a bent region located between the first region and the second region and bent about a bending axis that intersects the extending direction;
  an inorganic insulating layer located on the substrate and comprising a first opening or a first groove corresponding to the bent region;
  an organic material layer located on the substrate and filling the first opening or the first groove in the bent region, the organic material layer comprising a second opening or a second groove that is formed in a thickness direction of the substrate and extends in the extending direction intersecting the bending axis in a plan view; and
  a first conductive layer located on the organic material layer and having a bottom surface farther from the substrate than the second opening or the second groove of the organic material layer in the thickness direction,
  wherein the first conductive layer extends in the extending direction parallel to the second opening or the second groove in the bent region as being spaced apart from the second opening or the second groove, and wherein the organic material layer contacts a portion of a top surface of the inorganic insulating layer.

2. The display apparatus of claim 1, wherein the first opening or the first groove overlaps the bent region.

3. The display apparatus of claim 2, wherein an area of the first opening or the first groove is greater than an area of the bent region.

4. The display apparatus of claim 1, further comprising a second conductive layer electrically connected to the first conductive layer and located in the first region or the second region, and the second conductive layer is located on a layer different from a layer on which the first conductive layer is located.

5. The display apparatus of claim 4, wherein an elongation of the first conductive layer is greater than an elongation of the second conductive layer.

6. The display apparatus of claim 1, wherein the first conductive layer extends in a zigzag shape from the first region through the bent region to the second region, and the second opening or the second groove extends in the extending direction parallel to a direction in which the first conductive layer extends.

7. The display apparatus of claim 1, further comprising an additional conductive layer located in the second opening or the second groove and spaced apart from the first conductive layer.

8. The display apparatus of claim 7, wherein the additional conductive layer comprises a same material as a material included in the first conductive layer.

9. The display apparatus of claim 7, wherein the first conductive layer has a structure comprising multi-layers, and the additional conductive layer comprises a same material as a material included in at least one of the multi-layers of the first conductive layer.

10. The display apparatus of claim 7, wherein the first conductive layer has a structure comprising multi-layers, and the additional conductive layer comprises a same material as a material included in a lowermost layer of the multi-layers of the first conductive layer.

11. The display apparatus of claim 1, wherein the organic material layer further comprises a third opening or a third groove extending along the bending axis.

12. The display apparatus of claim 1, wherein the second opening or the second groove does not overlap the first conductive layer.

13. The display apparatus of claim 1, wherein a plurality of the first conductive layers are provided, and the second opening or the second groove is interposed between the plurality of first conductive layers.

14. The display apparatus of claim 1, further comprising a planarization layer located on the first conductive layer.

15. The display apparatus of claim 14, wherein the planarization layer extends from the first region through the bent region to the second region.

16. The display apparatus of claim 14, further comprising a bending protection layer located on the planarization layer.

17. The display apparatus of claim 1, wherein the bending region has a first width measured in the extending direction, the first opening or the first groove has a second width measured in the extending direction, and the second width is greater than the first width.

* * * * *